United States Patent
Duskin et al.

(10) Patent No.: US 8,003,478 B2
(45) Date of Patent: Aug. 23, 2011

(54) METHOD OF FORMING A BI-DIRECTIONAL DIODE AND STRUCTURE THEREFOR

(75) Inventors: Mark Duskin, Scottsdale, AZ (US); Suem Ping Loo, Tolleson, AZ (US); Ali Salih, Mesa, AZ (US)

(73) Assignee: Semiconductor Components Industries, LLC, Phoenix, AZ (US)

( * ) Notice: Subject to any disclaimer, the term of this patent is extended or adjusted under 35 U.S.C. 154(b) by 527 days.

(21) Appl. No.: 12/134,401

(22) Filed: Jun. 6, 2008

(65) Prior Publication Data

US 2009/0302424 A1 Dec. 10, 2009

(51) Int. Cl.
*H01L 21/20* (2006.01)
(52) U.S. Cl. .......... 438/380; 438/91; 438/237; 438/328; 438/983; 257/E21.356; 257/E29.335
(58) Field of Classification Search .................. 438/380, 438/91, 237, 328, 983; 257/603–606, E21.356, 257/E21.357, E29.335
See application file for complete search history.

(56) References Cited

U.S. PATENT DOCUMENTS

| | | | | |
|---|---|---|---|---|
| 2002/0130331 | A1* | 9/2002 | Nemoto et al. | 257/109 |
| 2003/0183855 | A1* | 10/2003 | Dries et al. | 257/200 |
| 2004/0183098 | A1* | 9/2004 | Khemka et al. | 257/200 |
| 2006/0014342 | A1* | 1/2006 | Khemka et al. | 438/237 |
| 2006/0211179 | A1* | 9/2006 | Siemieniec et al. | 438/138 |

OTHER PUBLICATIONS

M.Schitt et al., A Comparison of Electron, Proton and Helium Ion Irradiation for the Optimization of the CoolMOS Body Diode, 2002, Infineon Technologies, pp. 229-232.*
B. Jayant Baliga and Edmund Sun, "Comparison of Gold, Platinum, and Electron Irradiation for Controlling Lifetime in Power Rectifiers", IEEE Transations on Electron Devices, vol. ED-24, No. 6, Jun. 1977, pp. 685-688.
B. J. Baliga and A. O. Evwaraye, "Correlation of Lifetime with Recombination Centers in Electron-Irradiated P-Type Silicon", J. Electrochem. Soc.: Solid-State Science and Technology, Sep. 1983, pp. 1916-1918.

* cited by examiner

*Primary Examiner* — Angel Roman
(74) *Attorney, Agent, or Firm* — Robert F. Hightower

(57) ABSTRACT

In one embodiment, a bi-directional diode structure is formed to have a substantially symmetrical current-voltage characteristic.

10 Claims, 4 Drawing Sheets

US 8,003,478 B2

METHOD OF FORMING A BI-DIRECTIONAL DIODE AND STRUCTURE THEREFOR

BACKGROUND OF THE INVENTION

The present invention relates, in general, to electronics, and more particularly, to methods of forming semiconductor devices and structure.

In the past, the semiconductor industry utilized various methods and structures to form bi-lateral or bi-directional diode structures for applications such as electrode-static discharge (ESD) protection. The diodes usually were formed as zener diodes. Generally, it was desirable for the diode structure to have a symmetrical current-voltage characteristic curve and to also have a sharp knee for the current-voltage characteristic. However, it was difficult to obtain both a sharp knee for the current-voltage characteristic and to obtain a symmetrical current-voltage characteristic curve.

Accordingly, it is desirable to have a bi-directional diode structure that has a substantially symmetrical current-voltage characteristic curve, and that has a sharp knee for the current-voltage characteristic curve.

For simplicity and clarity of the illustration, elements in the figures are not necessarily to scale, and the same reference numbers in different figures denote the same elements. Additionally, descriptions and details of well-known steps and elements are omitted for simplicity of the description. As used herein current carrying electrode means an element of a device that carries current through the device such as a source or a drain of an MOS transistor or an emitter or a collector of a bipolar transistor or a cathode or anode of a diode, and a control electrode means an element of the device that controls current through the device such as a gate of an MOS transistor or a base of a bipolar transistor. Although the devices are explained herein as certain N-channel or P-Channel devices, or certain N-type or P-type doped regions, a person of ordinary skill in the art will appreciate that complementary devices are also possible in accordance with the present invention. The use of the word approximately or substantially means that a value of an element has a parameter that is expected to be very close to a stated value or position. However, as is well known in the art there are always minor variances that prevent the values or positions from being exactly as stated. It is well established in the art that variances of up to at least ten per cent (10%) (and up to twenty per cent (20%) for semiconductor doping concentrations) are reasonable variances from the ideal goal of exactly as described. For clarity of the drawings, doped regions of device structures are illustrated as having generally straight line edges and precise angular corners. However, those skilled in the art understand that due to the diffusion and activation of dopants the edges of doped regions generally may not be straight lines and the corners may not be precise angles.

DETAILED DESCRIPTION OF THE DRAWINGS

Figure 1:
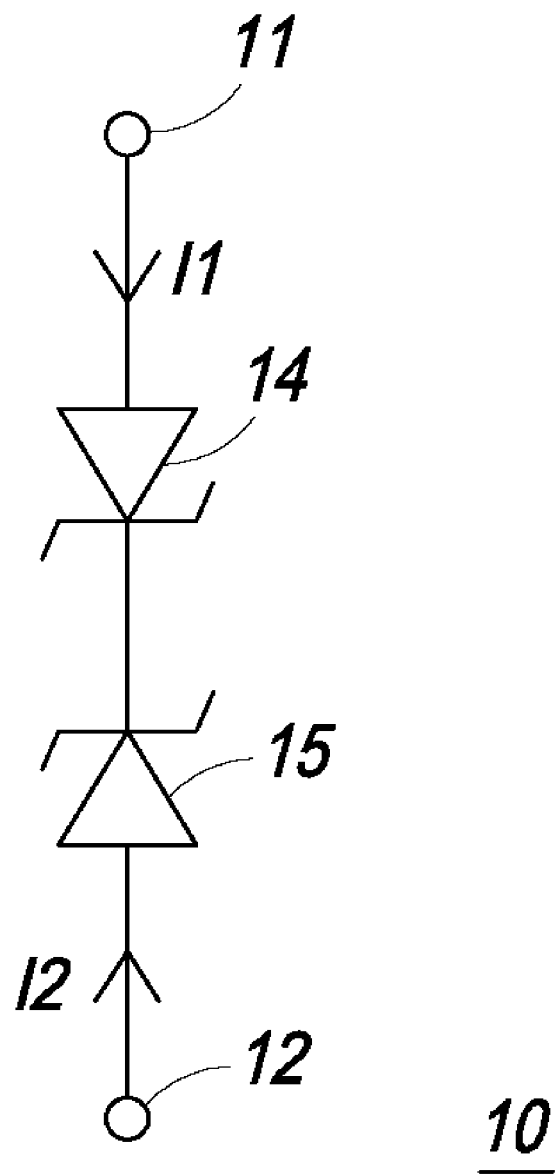
FIG. 1 schematically illustrates an embodiment of a portion of a bi-directional device in accordance with the present invention.

FIG. 1 schematically illustrates an embodiment of a portion of a bi-directional device 10 that has a substantially symmetrical current-voltage characteristic. Device 10 includes a zener diode 14, a zener diode 15, a first terminal 11, and a second terminal 12. The substantially symmetrical shape of the current-voltage characteristic means that diodes 14 and 15 each have a zener voltage that varies no greater than about thirty percent (30%) relative to the other diode. An anode of zener diode 14 is connected to terminal 11 and an anode of zener diode 15 is connected to terminal 12. A cathode of diode 14 is connected to a cathode of diode 15 giving diodes 14 and 15 a back-to-back configuration. Either of terminals 11 or 12 may be an input terminal with the other terminal being an output terminal. For example, terminal 11 may have a positive voltage relative to the voltage applied to terminal 12. If the voltage is greater than the forward voltage of diode 14 plus the zener voltage of diode 15, the voltage across device 10 would forward bias diode 14 and reverse bias diode 15 and cause a current I1 to flow from terminal 11 through diodes 14 and diode 15 to terminal 12. Similarly, terminal 12 may receive a voltage that is positive relative to the voltage that is applied to terminal 11. If the voltage across device 10 is greater than the forward voltage of diode 15 plus the zener voltage of diode 14, the voltage would forward bias diode 15 and reverse bias diode 14 causing a current I2 to flow from terminal 12 through diodes 15 and 14 and to terminal 11.

Figure 2:
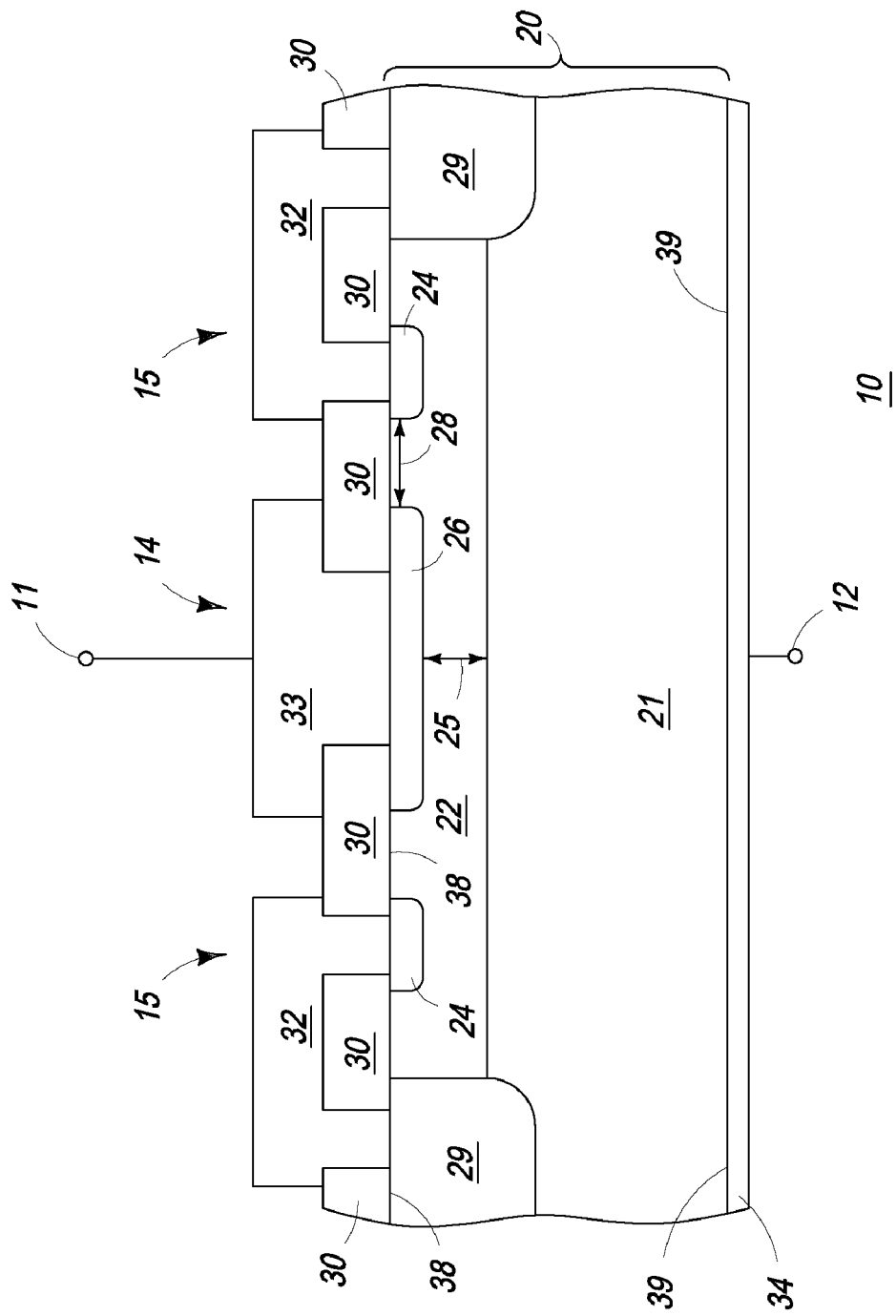
FIG. 2 illustrates an enlarged cross-sectional portion of a preferred embodiment of the bi-directional device of FIG. 1 in accordance with the present invention.

FIG. 2 illustrates an enlarged cross-sectional portion of a preferred embodiment of device 10.

Figure 3:
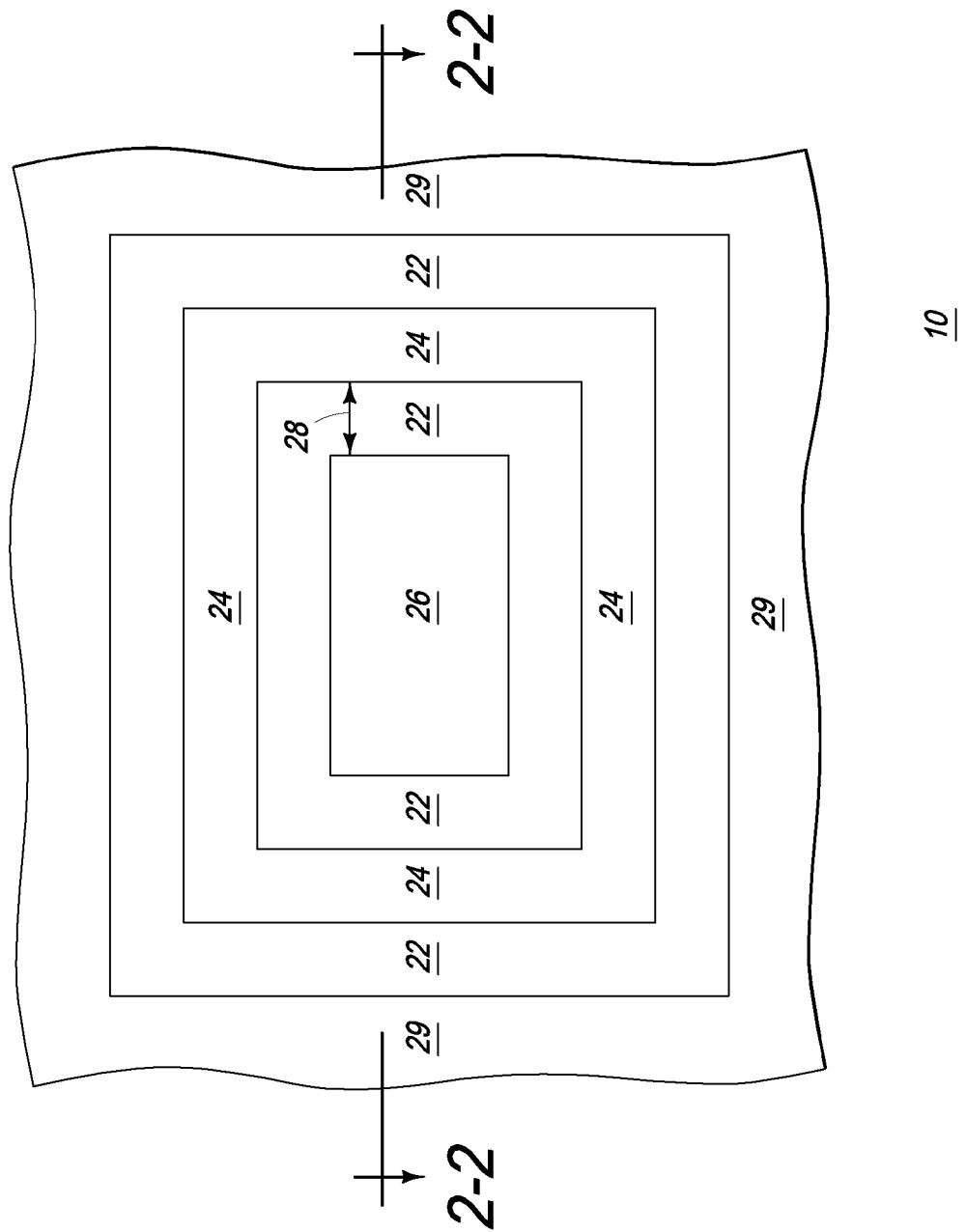
FIG. 3 illustrates an enlarged plan view of a portion of bi-directional device of FIG. 2 in accordance with the present invention.

FIG. 3 illustrates an enlarged plan view of a portion of device 10 prior to forming conductors 32 and 33 and dielectric regions 30 that are illustrated in FIG. 2. The cross-section of FIG. 2 is taken along cross-section line 2-2 of FIG. 3. This description has references to FIG. 1-FIG. 3. Device 10 is formed on a bulk semiconductor substrate 21 that preferably has a P-type conductivity. A semiconductor region 22 is formed to overlie a portion of substrate 21 and preferably is formed with an N-type conductivity. Region 22 preferably is formed as an N-type epitaxial layer on a surface 38 or top surface of bulk semiconductor substrate 21 wherein substrate 21 and the epitaxial layer form a semiconductor substrate 20 having semiconductor region 22. Region 22 alternately may be formed by doping a portion of substrate 21 with a dopant series that is opposite to the dopants of substrate 21. Typically, an isolation region 29 is formed to surround a portion of region 22 where diodes 14 and 15 are to be formed. Region 29 is formed on the surface of substrate 20 and extending through region 22 into bulk semiconductor substrate 21 in order to isolate that portion of region 22 from other portions of region 22. For the case where region 22 is formed as a doped region of substrate 21, isolation region 29 typically abuts that region 22 to ensure that it is separated from other adjacent portions of bulk semiconductor substrate 21. Isolation region 29 may be formed by a variety of techniques including doping a portion of substrate 20 with the same conductivity as substrate 21 and the opposite of region 22. Region 29 also facilitates forming electrical contact to substrate 21 from the surface of substrate 20.

In order to facilitate forming diode 14, a doped region 26 generally is formed on the surface of substrate 20 and within region 22 to extend a depth into substrate 20 that is less than the depth of region 22. Consequently, a portion of region 22 underlies region 26 and has a thickness or distance 25.

Another doped region 24 is utilized to assist in forming diode 15. Region 24 preferably is formed on the surface of substrate 20 and within region 22 to extend into region 22. Region 24 generally extends into region 22 approximately the same distance as region 26. Consequently, another portion of region 22 underlies region 26. As can be seen in FIG. 3, region 24 preferably is formed as a multiply-connected structure, such as a rectangle, having an interior opening that encloses region 26. The inner periphery of region 24 preferably is juxtaposed to the periphery of region 26 and is separated from region 26 by a distance 28. A dielectric layer usually is formed on the surface of substrate 20 and patterned to form dielectric regions 30 with openings that expose portions of isolation region 29, region 24, and region 26. A conductor material is applied onto device 10 and patterned to form conductors 32 and 33. Conductor 33 is formed to electrically contact the exposed portion of region 26 and form an ohmic contact thereto. Conductor 32 is formed to electrically contact region 24 and region 29 and form ohmic contacts thereto. Another conductor 34 is formed on a surface 39 of substrate 20 that is opposite to surface 38. After device 10 is assembled into a semiconductor package, conductor 33 is connected to terminal 11 of the semiconductor package and conductor 34 is connected to terminal 12 of the semiconductor package. In other embodiments, relationships of terminal 11 and 12 to conductors 33 and 34 may be reversed.

Referring to FIG. 3 and FIG. 2, the preferred embodiment of device 10 includes forming regions 24 and 26 to have substantially identical planar areas, such as the area at the surface of substrate 20 and substantially equal doping concentrations. This preferred configuration assists in forming the substantially symmetrical current-voltage characteristic for device 10 and assists in forming substantially equal capacitances for diodes 14 and 15. Additionally, the doping concentration of regions 24 and 26 preferably is formed to be less than a doping concentration of region 22. In general, device 10 is formed to have a first differential doping concentration of region 22 relative to regions 24 and 26 that is greater than a second differential doping concentration of substrate 21 relative to region 22 and that is greater than a third differential doping concentration of region 29 relative to region 22. This differential doping concentration forms the breakdown voltage of the two P-N junctions between region 22 and regions 24 and 26 to be less than the breakdown voltage of the P-N junction between region 22 and substrate 21 and less than the P-N junction between region 22 and region 29. Those skilled in the art will appreciate that a differential doping concentration is a difference between the doping concentrations of two doped regions. Thus, the differential doping concentration of region 22 relative to region 24 is the concentration of region 22 minus the concentration of region 24. The large differential doping concentrations assists in confining carrier conduction between diodes 14 and 15 to be within region 22 as will be seen further hereinafter. In the preferred embodiment, the doping concentration of regions 24 and 26 is about 4E15 atoms/cm$^3$, the doping concentration of region 22 is about 2E18 atoms/cm$^3$, the doping concentration of region 29 is about 2E16 atoms/cm$^3$, and the doping concentration of substrate 21 is about 1E19 atoms/cm$^3$.

Figure 4:
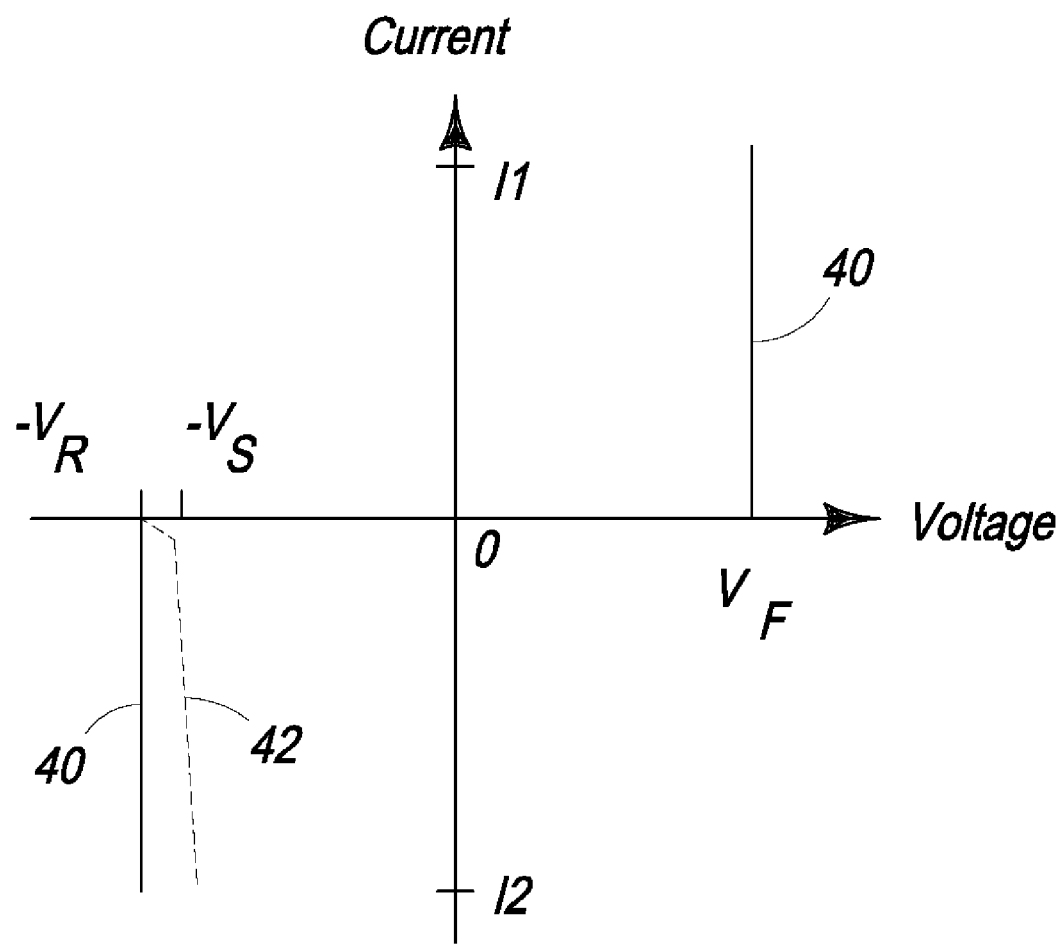
FIG. 4 is a graph illustrating a current-voltage characteristic curve for the bi-directional device of FIG. 1 and FIG. 2 in accordance with the present invention.

FIG. 4 is a graph illustrating the substantially symmetrical current-voltage characteristic of device 10. The abscissa indicates the voltage of terminal 11 relative to terminal 12, and the ordinate indicates the value of current flowing from terminal 11 through device 10 to terminal 12. A plot 40 illustrates the current-voltage characteristic curve of device 10 for a variety of applied voltage values across device 10 from zero volts up to a voltage that is at least a forward activation voltage and a reverse activation voltage. The forward activation voltage (Vf) occurs when terminal 11 is biased positively relative to terminal 12 at a value that is sufficient to cause diode 14 to be forward biased and diode 15 to be reverse biased at the zener voltage (Vz) thereof. Similarly, the reverse activation voltage (−Vr) occurs when terminal 11 is negatively biased relative to terminal 12 at a value that is sufficient cause diode 15 to be forward biased and diode 14 to be reverse biased at the zener voltage (Vz) thereof. A plot 42 illustrates, as a dashed line, an undesirable snap-back characteristic that is not present in the current-voltage characteristics of device 10. This description has references to FIG. 1, FIG. 2, and FIG. 4.

When the forward activation voltage (Vf) is applied to device 10, terminal 11 is biased positively relative to terminal 12 and current I1 flows from terminal 11 through the forward biased P-N junction between regions 26 and 22 and into the drift region formed by region 22. Current I1 flows laterally through region 22 to the reverse biased junction between regions 22 and 24, through conductor 32 to region 29, through region 29 to substrate 21, and to terminal 12. Because terminal 11 is more positive than terminal 12, the P-N junction between substrate 21 and region 22 is reverse biased. Because of the doping concentrations between regions 24 and 26 to region 22, those respective P-N junctions have a lower breakdown voltage than the P-N junction of region 22 to substrate 21, thus, current I1 is constrained to flow through region 22. It can be seen that conductor 32 forms a conduction path that allows the current from diode 15 to flow through region 29 and substrate 21 to terminal 12.

When terminal 11 is negatively biased relative to terminal 12, current I2 flows from terminal 12 through substrate 21, through region 29 and conductor 32 into region 24, across the forward biased P-N junction between regions 24 and 22, laterally through the drift region formed by region 22 to the reverse biased P-N junction between regions 22 and 26 thereby to terminal 11. Since the P-N junction between substrate 21 and region 22 is forward biased, substrate 21 and regions 22 and 26 form a PNP transistor. Thus, another other potential conducting path from terminal 12 to terminal 11 would be through the PNP transistor of substrate 21 and regions 22 and 26. In order to easily form regions 29 at a low cost, region 26 extends into region 22 such that thickness/distance 25 of region 22 separates the bottom of region 26 from the bottom of region 22. When terminal 11 is biased negatively relative to terminal 12, this small distance between region 26 and substrate 21 (in addition to the doping concentration of region 22) could cause the PNP transistor to be enabled and conduct current. If the PNP transistor were enabled, the voltage across device 10 would decrease from the reverse activation voltage (−Vr) down to a snap-back voltage (−Vs) as illustrated by the dashed line in FIG. 4. This is commonly referred to as a snap-back effect in the current-voltage characteristic of device 10 where the voltage decreases as the current increases. Those skilled in the art will appreciate that the snap-back effect occurs during the operation of device 10 is not the same as the case where the device fails in a shorted condition so that current increases and the voltage decreases to approximately zero.

In order to prevent this snap-back, the recombination lifetime of carriers within region 22 is adjusted to a lower value such that the carriers formed at the P-N junction between regions 26 and 22 recombine quickly and do not have a sufficient lifetime to transit across thickness/distance 25 into substrate 21. In the preferred embodiment, the carrier recombination lifetime within region 22 is adjusted by bombarding or irradiating device 10 with an electron beam. The electron beam irradiation creates scattering sites within the crystal lattice structure of substrate 21 thereby causing recombination sites that reduce the carrier mobility thereby reducing the carrier recombination lifetime within region 22. In the preferred embodiment, device 10 is exposed to electron beam radiation and energy of 10 Mev and a dose of 32 KGy. Preferably, device 10 is irradiated under these conditions four separate times. However, it is believed that any dose of particles that can traverse completely through device 10 can lower the carrier recombination lifetime. The carrier recombination lifetime within region 22 preferably is reduced by approximately twenty percent to eighty percent (20%-80%). Reducing the carrier recombination lifetime substantially eliminates the snap-back effect and forms the current-voltage characteristic to have a substantially symmetrical shape. Irradiating device 10 also reduces the carrier recombination lifetime within all doped regions of device 10. Because device 10 is not used to provide a current gain or voltage gain, reducing the carrier recombination lifetime within these regions does not affect the operation of device 10. Additionally, reducing the carrier recombination lifetime in region 22 forms the current-voltage characteristic to increase the voltage drop across device 10 for increasing values of current flow through device 10 without a snap-back effect where the voltage decreases as the current increases.

Breakdown of the P-N junction between region 22 and regions 24 and 26, and the related snap-back, generally do not occur. However, if distance 28 becomes less than about twenty-five (25) microns, there is a possibility that breakdown could occur between regions 24 and 26. However, reducing the carrier recombination lifetime within region 22 also inhibits this breakdown even if distance 28 is less than twenty-five microns. In one embodiment, thickness/distance 25 is approximately eight microns and the reduced recombination lifetime of the carriers prevented snap-back during the operation of the device.

Device 10 may be used in a variety of applications and often is connected between two terminals of a piece of electronic equipment to protect the equipment from over-voltage situations such as an electro-static discharge event. For example, device 10 may be connected between two wires of a communications system in order to prevent electro-static discharge from traveling through the wires to a piece of equipment connected to the wires. For such an application, it would be important for device 10 to have a very low capacitance while device 10 is not conducting current and to preferably have an even lower capacitance when device 10 conducts current resulting from an electro-static discharge event. The low capacitance when device 10 is not conducting allows fast data transmission without the capacitance of device 10 interfering therewith. Reducing the carrier recombination lifetime within region 22 also reduces the capacitance between region 22 and regions 24 and 26 thereby reducing both the capacitance of device 10 when device 10 is not conducting and when device 10 is conducting current.

In view of all of the above, it is evident that a novel device and method is disclosed. Included, among other features, is reducing the carrier recombination lifetime within the drift region of the diode structure. Reducing the carrier recombination lifetime prevents the P-N junction between the drift region and the adjacent semiconductor material from breaking down when the voltage applied across the diode structure is greater than the breakdown voltage of the junction. Those skilled in the art will appreciate that because of the low doping of the semiconductor regions adjacent to the drift region, reducing the carrier recombination lifetime within low doped region reduces the junction capacitance of the diode formed at the interface thereof.

While the subject matter of the invention is described with specific preferred embodiments, it is evident that many alternatives and variations will be apparent to those skilled in the semiconductor arts. For example, a variety of methods may be used to reduce the carrier recombination lifetime of the drift region. Although the subject matter of the invention is described using the preferred embodiment, other doping concentrations may be used to form the device. In other embodiments, the planar areas may not be approximately equal especially if substantially equal capacitances are not necessary. Also, the structure and relative positioning of the P-N junctions that form diodes 14 and 15 may be altered as long as the structure forms back-to-back diodes. Additionally, the diodes may be other types of diodes in addition to zener diodes. Additionally, the word "connected" is used throughout for clarity of the description, however, it is intended to have the same meaning as the word "coupled". Accordingly, "connected" should be interpreted as including either a direct connection or an indirect connection.

The invention claimed is:

1. A method of forming a bi-directional diode comprising:
    forming a first doped region overlying a semiconductor region of a first conductivity type and a first doping concentration wherein the first doped region has a second conductivity type and a second doping concentration;
    forming a second doped region of the first conductivity type within the first doped region;
    forming a third doped region of the first conductivity type within the first doped region and spaced a first distance from the second doped region and having a third doping concentration wherein a differential doping concentration between the first doped region and the third doped region is greater than a differential doping concentration between the first doped region and the semiconductor region; and
    reducing a recombination lifetime of carriers within the first doped region subsequently to forming the second and third doped regions.

2. The method of claim 1 wherein forming the first doped region includes forming the first doping concentration and the second doping concentration to have a differential doping concentration that is less than a differential doping concentration between the second and third doping concentrations.

3. The method of claim 2 wherein forming the second doped region includes forming the second doped region with the first conductivity type and a fourth doping concentration wherein a differential doping concentration between the second and fourth doping concentrations is greater than the differential doping concentration between the first and second doping concentrations.

4. The method of claim 3 wherein forming the third doped region includes forming the third doped region with an inner periphery that surrounds a periphery of the second doped region.

5. The method of claim 1 wherein forming the third doped region includes forming the third doped region no greater than about twenty five microns from the second doped region.

6. The method of claim 1 wherein reducing the carrier recombination lifetime within the first doped region includes irradiating the bi-directional diode with one of particle bombardment, an electron beam, a proton beam, a neutron beam, or gamma particles prior to assembling the bi-directional diode into a semiconductor package.

7. The method of claim 6 wherein irradiating the bi-directional diode includes irradiating the bi-directional diode at a dose of no less than 32 Kgy.

8. A method of forming a diode comprising:
providing a semiconductor substrate of a first conductivity type and a first doping concentration and having a surface;
forming a semiconductor region overlying at least a portion of the semiconductor substrate wherein the semiconductor region has a second conductivity type and a second doping concentration that is less than the first doping concentration;
forming a first diode within the semiconductor region including forming a first doped region within the semiconductor region and having a third doping concentration that forms a differential doping concentration with the semiconductor region that is greater than a differential doping concentration between the semiconductor substrate and the semiconductor region; and
reducing a carrier recombination lifetime within the first portion of semiconductor region.

9. The method of claim 8 further including forming a second diode in the semiconductor region and spaced a first distance from the first diode wherein a first portion of the semiconductor region forms a drift region for current flow between the first diode and the second diode; and wherein forming the first diode and forming the second diode includes forming a second portion of the semiconductor region underlying the first diode and having a thickness no greater than about twenty five microns, and forming a third portion of the semiconductor region underlying the first diode and having a thickness no greater than about twenty five microns.

10. A method of forming a diode comprising:
providing a semiconductor substrate of a first conductivity type and a first doping concentration and having a surface;
forming a semiconductor region overlying at least a portion of the semiconductor substrate wherein the semiconductor region has a second conductivity type and a second doping concentration that is less than the first doping concentration;
forming a first diode within the semiconductor region;
forming a second diode in the semiconductor region and spaced a first distance from the first diode wherein a first portion of the semiconductor region forms a drift region for current flow between the first diode and the second diode; and wherein forming the first diode and the second diode includes forming a first doped region within the semiconductor region and having the first conductivity type and a third doping concentration that is less than the second doping concentration, and forming a second doped region within the semiconductor region and having the first conductivity type and the third doping concentration; and
reducing a carrier recombination lifetime within the first portion of semiconductor region.

* * * * *